US005300404A

United States Patent [19]

Tani et al.

[11] Patent Number: 5,300,404

[45] Date of Patent: Apr. 5, 1994

[54] PROCESS FOR FORMING A POSITIVE PATTERN THROUGH DEEP ULTRAVIOLET EXPOSURE, HEAT TREATMENT AND DEVELOPMENT WITH TMAH SOLUTION CONTAINING AN ALCOHOL TO IMPROVE ADHESION

[75] Inventors: Yoshiyuki Tani, Neyagawa; Masaru Sasago, Hirakata, both of Japan

[73] Assignee: Matsushita Electric Industrial Co., Ltd., Osaka, Japan

[21] Appl. No.: 864,131

[22] Filed: Apr. 6, 1992

Related U.S. Application Data

[63] Continuation of Ser. No. 646,025, Jan. 28, 1991, abandoned.

[30] Foreign Application Priority Data

Jan. 30, 1990 [JP] Japan ........................ 2-019532

[51] Int. Cl.[5] ........................ G03F 7/30; G03F 7/32

[52] U.S. Cl. ........................ 430/326; 430/330; 430/331

[58] Field of Search ........................ 430/326, 331, 330

[56] References Cited

U.S. PATENT DOCUMENTS

| | | | |
|---|---|---|---|
| 4,384,037 | 5/1983 | Hosaka et al. | 430/191 |
| 4,812,880 | 3/1989 | Ogawa et al. | 430/193 |
| 4,968,581 | 11/1990 | Wu et al. | 430/192 |

*Primary Examiner*—Charles L. Bowers, Jr.
*Assistant Examiner*—Christopher G. Young
*Attorney, Agent, or Firm*—Nikaido, Marmelstein, Murray & Oram

[57] ABSTRACT

A pattern with good adhesiveness to a substrate and good shape and heat resistance can be formed by coating a pattern forming material comprising (a) a resin, (b) a photoacid generator and (c) a solvent on the substrate, exposing to deep UV light, and developing using a mixed solvent of tetramethylammonium hydroxide and an alcohol.

3 Claims, 4 Drawing Sheets

1.0
0.5
0
NORMALIZED INITIAL THICKNESS
10
100
EXPOSURE ENERGY mJ/cm2

PROCESS FOR FORMING A POSITIVE PATTERN THROUGH DEEP ULTRAVIOLET EXPOSURE, HEAT TREATMENT AND DEVELOPMENT WITH TMAH SOLUTION CONTAINING AN ALCOHOL TO IMPROVE ADHESION

This application is a continuation of application Ser. No. 07/646,025 filed Jan. 28, 1991, now abandoned.

BACKGROUND OF THE INVENTION

This invention relates to a pattern forming method.

Recently, with the promotion of higher density integration of semiconductor devices, the light source wavelength of an exposure device used for fine process, especially photolithography is more and more shortened. At present i-line (365 nm) has entired its practical use and KrF excimer laser (248.4 nm) is already investigated. However, resist pattern materials, especially resist materials suitable for KrF excimer laser, and deep UV wavelength ranges have not been developed sufficiently. For example, even when MP2400 (Shipley Co.) which is said to have high sensitivity and transmittance for KrF excimer laser light is used, because of the surface absorption of a novolac resin which is a base polymer and poor optical reactivity of a sensitizer, a naphthoquinone diazide compound, pattern profile after pattern formation is too low in quality to be used.

Also as a pattern forming material for deep UV, there is reported a resist which contains of 2-diazo-1,3-dione compound with high transmittance for deep ultraviolet light of near 248.4 nm. However, compared with the transmittance of 70% of the base polymer of the resist, the transmittance of the pattern forming material after exposure is only 45%, and enough photobleach is not obtained. Also as a result of pattern forming experiments, it is found that the pattern has an angle of approx. 70 degrees which value is insufficient compared with a pattern shape which becomes a satisfying etching mask with a vertical shape.

Also it has become clear that the sensitivity of this pattern forming material is as low as from 140 to 150 mJ/cm$^2$. That is, the high transparent pattern forming material containing a 2-diazo-1,3-dione compound has low sensitivity, and is difficult for a practical use when there is used KrF excimer laser light of which energy efficiency is poor.

In recent years, as a means to decrease exposure energy quantity, a material comprising poly(tert-butoxy carbonate (t-BOC)) styrene and an onium salt was proposed. This is a chemical amplification pattern forming material which generates an acid by exposure to light, said acid acting as a catalyst. Various reports have been made recently [e.g. Polym. Eng. Sci. volume 23, page 1012 (1983)]. A pattern forming method using such a known chemical amplification pattern forming material is explained referring to FIG. 1. The pattern forming material 12 is spin-coated on a semiconductor substrate 1, and it is soft baked for 90 seconds on a hot plate of 90° C. to obtain a film of pattern forming material of 1.0 μm thick (FIG. 1(*a*)). In most cases, an insulation film, an electroconductive film and an oxide film are formed on the substrate 1. Next, an acid is generated from a photoacid generator in the material 12 as shown in the following chemical change by exposure to KrF excimer laser (248.4 nm) 4 through a mask 5 (FIG. 1(*b*)).

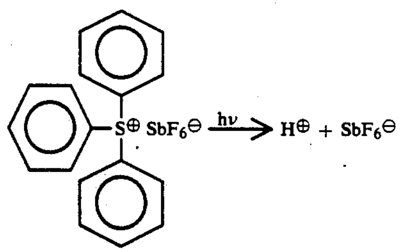

Then, the chemical change mentioned below is caused by the heat treatment (post exposure bake, i.e. PEB) of the said material film on a hot plate 3 for 90 seconds at 130° C., and the resin becomes alkali soluble (FIG. 1(*c*)).

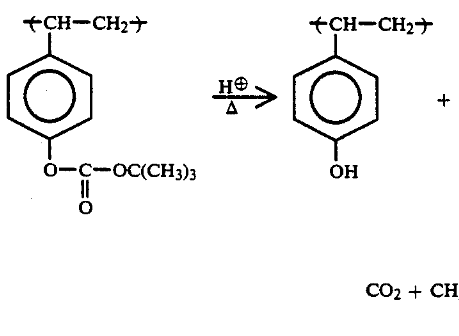

$$CO_2 + CH_2 = C(CH_3)_2$$

Finally, positive type pattern **12*a* and 12*c* are obtained by dissolution and removal of exposed part 12 of the pattern forming material 12 by using an alkaline developer (MF-319, mfd. by Shipley Co.) (FIG. 1**(*d*)).

But it was found impossible to apply this method to formation of fine patterns **12*c* on the substrate as in FIG. 1**(*d*), if the pattern size is 1.0 μm or less, especially 0.5 μm or less. That is, a fine resist pattern 12, which is to be retained, is not retained. A reason why super fine patterns are not formed was proved to be the low adhesiveness between the pattern forming material and the substrate according to the present inventors' investigation. Although this is not a problem in a device production of several μm level as in the said instance, this is a fatal problem in a process for forming fine patterns of 1 μm or less, especially super fine patterns of 0.5 μm or less in high density. Consequently, it is impossible to produce a device of submicron rule. Thus, the reason why the super fine patterns are not formed turned out to be the low adhesiveness between the pattern forming material and the substrate. Since poly (t-BOC)styrene resin conventionally used for a pattern forming material does not contain a hydrophilic radical in its molecule, when it is made into a thin film, it becomes hydrophobic. As for the substrate, since hydrophobic treatment with hexamethyldisilazane (HMDS) is performed before forming a pattern forming material film, the substrate surface is hydrophobic. Since the hydrophobic substrate and the hydrophobic pattern forming material have poor adhesiveness, the exposed part of the resist material is dissolved and removed during development after patternwise exposure. At the same time, an unexposed part of the resist material, which should not be dissolved, is removed because of poor adhesiveness, and does not remain on the substrate. This phenomenon becomes especially remarkable in fine patterns of 1 μm or less. Therefore, it is extremely important to prevent this in the production of highly profitable super fine semiconductor integrated circuits having super fine patterns of 1 μm or less, particularly 0.5 μm or less.

SUMMARY OF THE INVENTION

It is an object of the present invention to provide a secure method to form fine patterns with a good shape of which film does not peel off by using a chemical amplification pattern forming material as well as by improving adhesiveness.

This invention relates to a resist pattern forming method used for the production of semiconductor elements and others, and to a pattern forming method to form positive type patterns using deep UV light, excimer laser of 400 nm or less, for instance, as an exposure energy source.

The present invention provides a process for forming a pattern which comprises forming on a substrate a film of pattern forming material comprising (a) a resin having functional groups capable of becoming alkali-soluble under an acid atmosphere, (b) a photoacid generator being able to generate an acid by exposure to light, and (c) a solvent for dissolving both the components (a) and (b), exposing the film selectively to deep ultraviolet light, and developing the resulting film with a mixed solvent comprising tetramethylammonium hydroxide and an alcohol to form the desired pattern.

DETAILED DESCRIPTION OF THE PREFERRED EMBODIMENTS

Figure 1A:
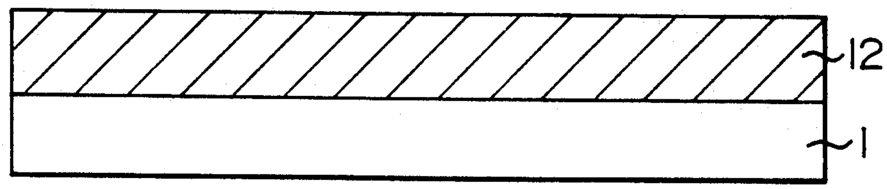
FIGS. 1(*a*) to 1(*d*) are cross-sectional views explaining a prior art pattern forming process.
Figure 1B:
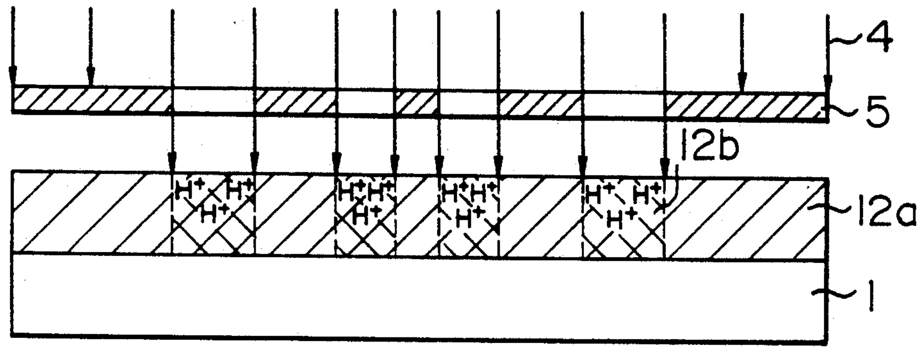
Figure 1C:
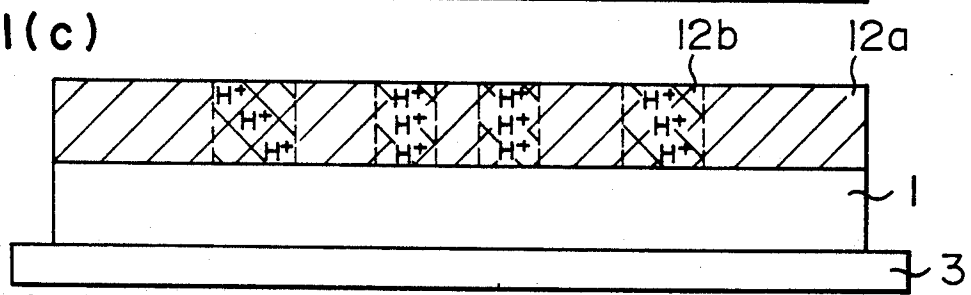
Figure 1D:
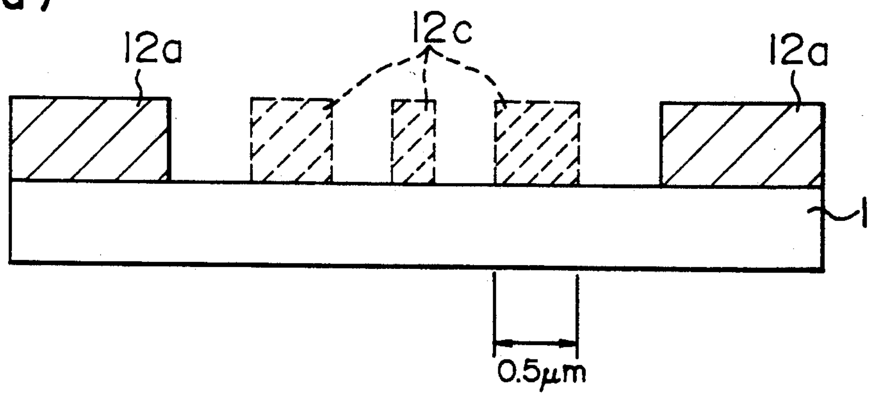
Figure 2A:
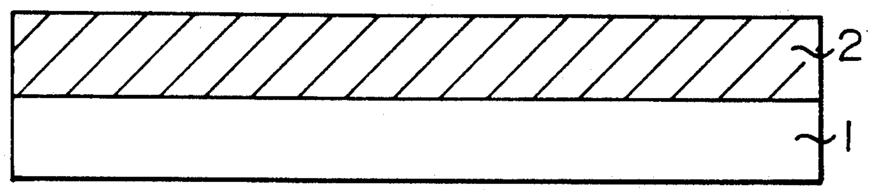
FIGS. 2(*a*) to 2(*d*) are cross-sectional views explaining an embodiment of this invention.
Figure 2B:
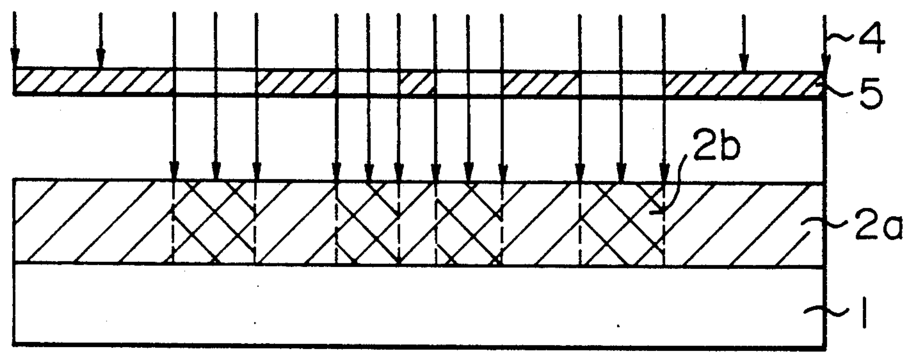
Figure 2C:
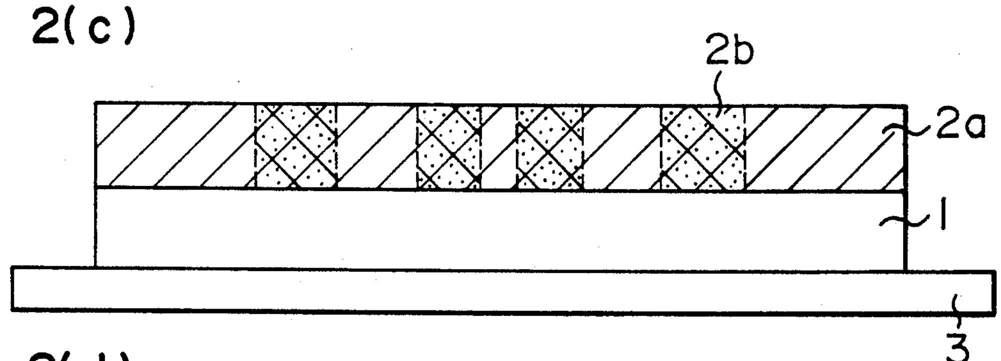
Figure 2D:
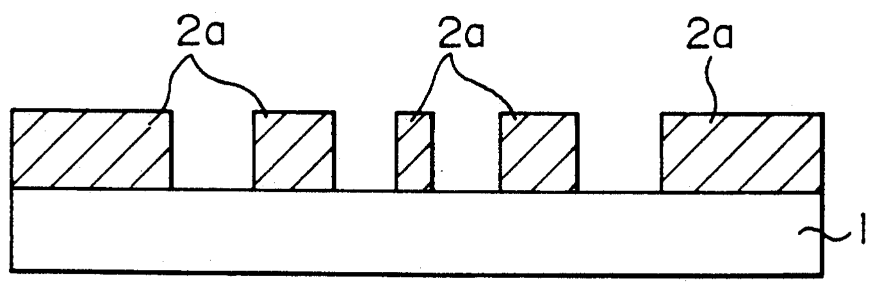

A concrete explanation of this invention is as follows. An acid is generated from a photosensitive compound (b) (a photoacid generator) in a pattern forming material film exposed to deep UV light such as KrF excimer laser. Functional groups of a resin (a) are chemically changed by the acid into alkali-soluble during a heat treatment after exposure to light and released into a developer at the time of development.

On the other hand, since no acid is generated on an unexposed part, the chemical change does not occur in the heat treatment to produce alkali-soluble group. As a result, a positive type pattern with fine contrast is formed by the method of this invention. Also since the acid generated by exposure functions as a catalyst, reduction of exposure energy becomes possible because of generation of only necessary amount of acid by exposure to light. Peeling of fine patterns at the time of development is a serious problem in the production of submicron rule device.

Therefore in this invention, by using a mixed solvent of tetramethylammonium hydroxide (TMAH) and an alcohol as the developer, high polarity of the solvent can be attained.

As the alcohol, there can be used methanol, ethanol, isopropanol or a mixture thereof, but not limited thereto.

Since said developer with high polarity is absorbed on the hydrophobic surface of pattern forming material film and makes the surface hydrophilic, good wettability can be obtained as a result. It is considered that since such absorbed layers are also formed on the sides of the remaining patterned material film, penetration of the developer into an interface between the remaining patterned material film and the substrate as well as peeling off of the patterns can be prevented. Also improvement of wettability of developer on the pattern forming material film surface increases the difference in dissolving speed at exposed part and unexposed part, resulting in improving sensitivity. In this way, the pattern forming method using the mixed solvent of TMAH and alcohol as the developer enables to form highly adhesive super fine patterns with high sensitivity, and becomes indispensable in the forming process of super fine device of 0.5 μm or less.

This invention is explained more in detail below.

The present inventors had thought that the reason of peeling off of the pattern lies in the polarity of the developer and investigated by using developers with higher polarity. As a result of various experiments to improve the polarity of the developer, it was found out that an addition of alcohol to a conventional TMAH aqueous solution is the most effective to prevent peeling off of patterns by the improvement of polarity. As the alcohol, methanol, ethanol and isopropyl alcohol with high polarity especially showed good results. Further, n-propanol or butanol with a little lower polarity also showed similar good results. Thus, these alcohols can also be used in this invention.

As the functional group of the resin (a), there can be used methyl, isopropyl, tert-butyl, methoxymethyl, isopropoxymethyl, tetrahydropyranyl, tetrahydrofuranyl, trimethylsilyl, tert-butoxycarbonyl, isopropoxycarbonyl and so on. However, other groups can also be used so long as they can become alkali-soluble in acid ambience.

Similarly, any photoacid generator can be used if it generates an acid by exposure to light, such as nitrobenzyl compounds, onium salts, sulfonic acid compounds, carbonyl acid compounds, etc., but not limited thereto.

As the solvent (c), there can be used those capable of dissolving both the resin (a) and the photoacid generator (b).

This invention is illustrated by way of the following Examples but not limited thereto.

EXAMPLE 1

A pattern forming material was prepared by using the following ingredients.

(1) 30 g

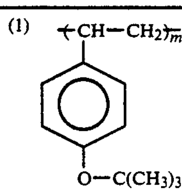

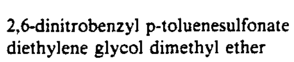

(2) 2,6-dinitrobenzyl p-toluenesulfonate 1 g (3) diethylene glycol dimethyl ether 70 g -continued

| (Diglyme) |
|---|

As the resin (1), there was used that having a tert-butoxy group as a functional group which shows alkali-solubility under an acid atmosphere.

The tert-butoxy group cuts the C—O bond with heating under an acid atmosphere as shown below, resulting in forming a hydroxyl group.

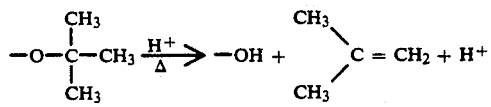

The photoacid generator (2) generates an acid by exposure to light as follows:

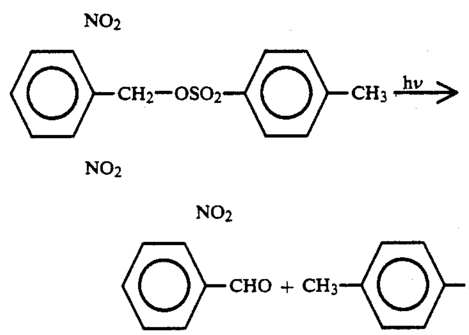

The solvent (3) can dissolve both the resin and the photoacid generator and has high transmittance in the deep UV region. Thus, the solvent is expected to provide good results when used in the pattern forming material for KrF excimer laser.

The pattern forming method of the present invention is explained referring to FIGS. 2(*a*) to 2(*d*).

A resist thin film is formed by spin coating the pattern forming material 2 prepared as mentioned above on a semiconductor substrate 1 such as silicon, soft baking at 90° C. for 90 sec. on a hot plate 3 and removing the solvent in the thin film by evaporation to give the thin film of 1.0 μm thick (FIG. 2(*a*)). The substrate may have an insulating film, an electroconductive film or a semiconductor film on the surface thereof. Next, the photoacid generator (2) is decomposed photochemically as mentioned above by exposing to KrF excimer laser (248.4 nm) 4 through a mask 5 (FIG. 2(*b*)). Then the film is baked (PEB) at 110° C. for 90 sec. on the hot plate 3 to make the tert-butoxy group alkali-soluble by the reaction mentioned above (FIG. 2(*c*)).

Finally, the exposed part 2b of the pattern forming material film 2 is dissolved and removed by an aqueous solution of TMAH 2.38% and isopropanol 5% to give a positive type pattern 2a (FIG. 2(*d*)).

Figure 3:
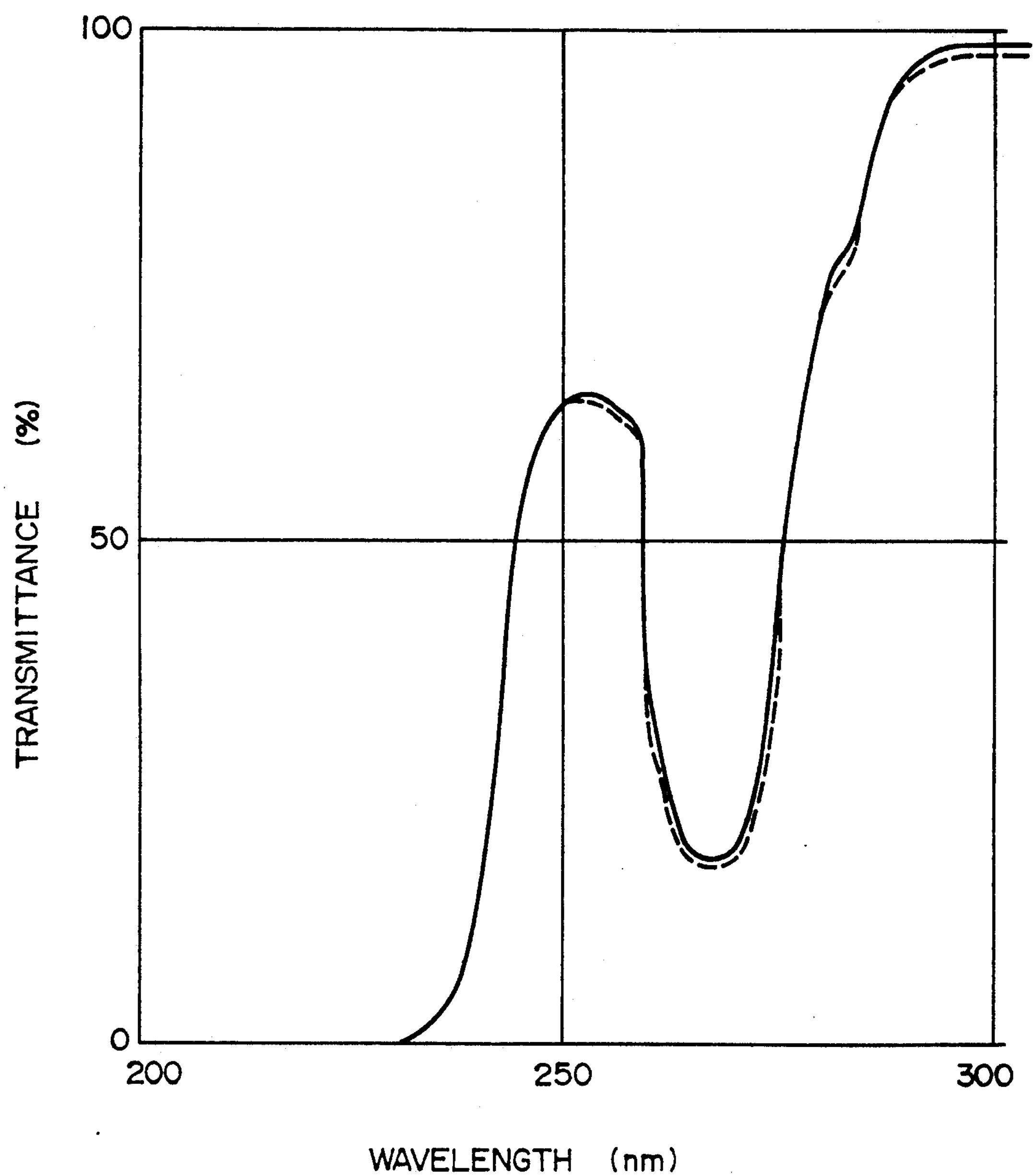
FIG. 3 is a UV spectral diffraction curve of the pattern forming material of Example 1.

UV spectral diffraction curve of the pattern forming material used in this invention (film thickness 1 μm) before and after the exposure is shown in FIG. 3. In FIG. 3, the solid line is before the exposure and the broken line is after the exposure. As shown in FIG. 3, the transmittance is as high as approx. 65% with no changes before and after the exposure. As a result of the pattern forming experiment, it was possible to form a 0.3 μm line and space pattern which has a good shape as resist pattern 2a with no prior art peeling problem of the pattern.

Figure 4:
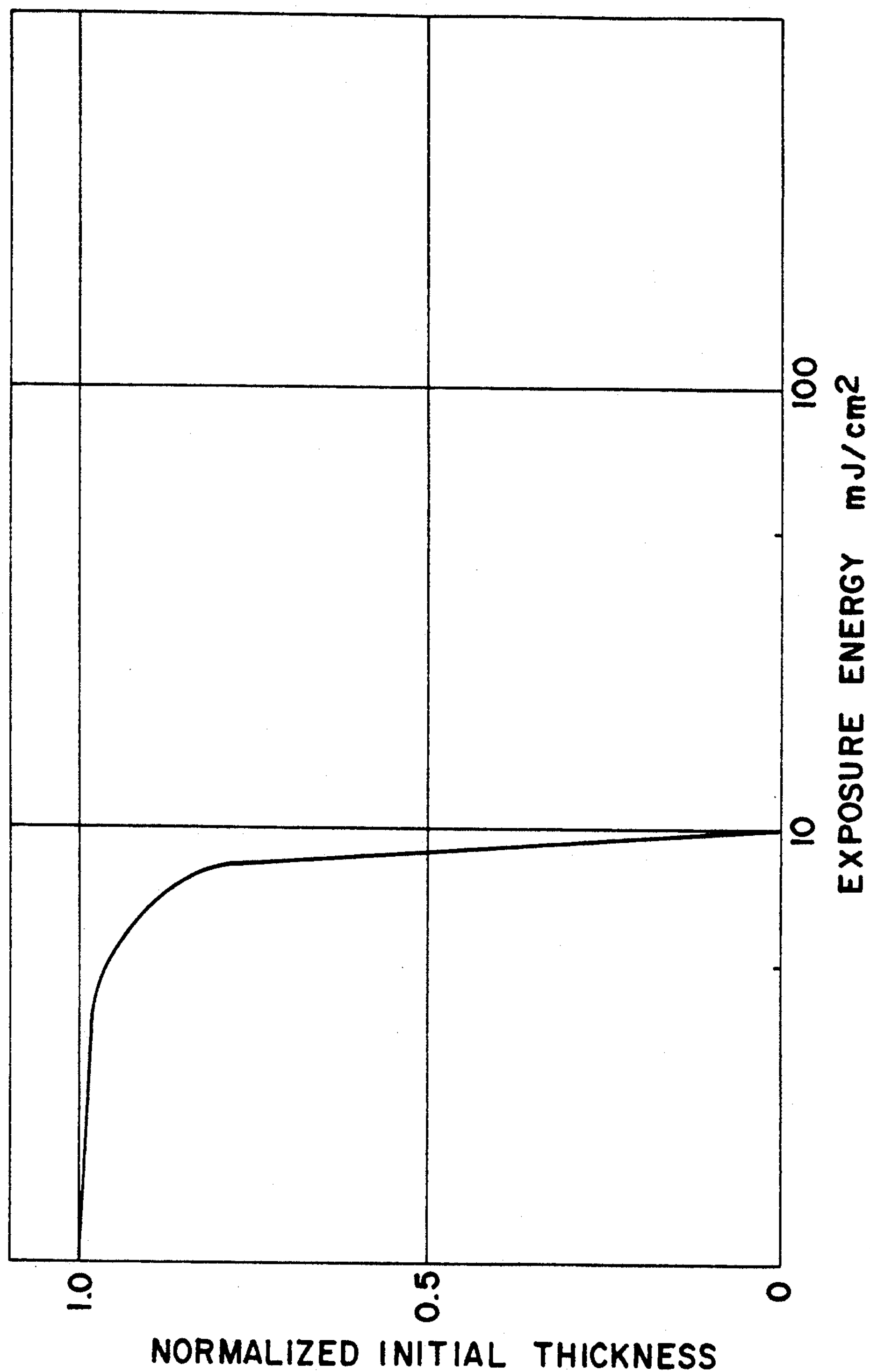
FIG. 4 is a graph showing irradiation characteristics of the pattern forming material of Example 1.

Furthermore, irradiation characteristics of this pattern forming material (1 μm) are shown in FIG. 4. It shows high contrast and high sensitivity. The γ value was 5.5 and the sensitivity was 10 $mJ/cm^2$. Here, resolution limit and comparison between one example of the pattern forming material of this invention and prior art material are shown in the following Table.

| Material of substrate 1 | Items for evalution | Pattern forming method of this invention (2a) | Prior art pattern forming method (12a) |
|---|---|---|---|
| Silicon | Resolution (μm) | 0.3 | 1.0 |
| | Pattern angle (degree) | 90 | 90 |
| | Sensitivity ($mJ/cm^2$) | 10 | 15 |
| $SiO_2$ | Resolution (μm) | 0.3 | 2.0 or more |
| | Pattern angle (degree) | 90 | 90 |
| | Sensitivity ($mJ/cm^2$) | 10 | 14 |
| Spin on glass (SOG) | Resolution (μm) | 0.3 | 2.0 |
| | Pattern angle (degree) | 90 | 90 |
| | Sensitivity ($mJ/cm^2$) | 10 | 16 |

This Table is explained below.

In the prior art pattern 12a forming method, it is possible to form good patterns on various substrates, but it is impossible to form fine patterns because adhesiveness to substrates is weak.

For example, when the silicon substrate is used in the prior art pattern forming method, super fine patterns of 1 μm or less are peeled off during the developing process, resulting in failing to form patterns on the substrate. On the other hand, in the pattern forming method of this invention, it is possible to resolve up to 0.3 μm which is the resolution limit due to the improved sensitivity by approx. 30% with good adhesiveness.

Further when the $SiO_2$ substrate and the spin on glass (SOG) substrates, which are low in adhesiveness to a resist, are used in the prior art pattern forming method, even patterns of 3 μm or less cannot be formed. However, it is possible to form patterns up to the resolution limit mentioned above as to the silicon substrate in the pattern 2a forming method of this invention.

As mentioned above, according to the pattern forming method of this invention, the resolving degree is marvelously improved because the patterns do not peel off compared with the prior art method. It is also possible to form good shape which is a characteristic of the chemical amplification type. Moreover, good patterns can be formed without peeling off even on $SiO_2$ and spin on glass (SOG) substrates which are conventionally known to have poor adhesiveness. In short, it is possible to form super fine patterns of 0.5 μm or less in a good shape without peeling in the pattern forming method of this invention. Therefore, it is significant to form a submicron rule semiconductor device with high productivity.

EXAMPLE 2

The process of Example 1 was repeated except for using the following photoacid generator:

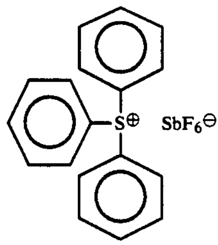

As a result, a good result of sensitivity 5 $mJ/cm^2$ was obtained as in Example 1.

EXAMPLE 3

The process of Example 1 was repeated except for using the following photoacid generator:

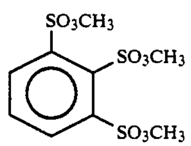

As a result, a good result of sensitivity 15 $mJ/cm^2$ was obtained as in Example 1.

EXAMPLE 4

The process of Example 1 was repeated except for using the following resin:

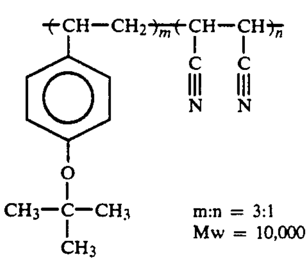

In this resin, the group for improving heat resistance (C≡N) is introduced. This resin has enough heat resistance to be used as a pattern forming material because Tg is 160° C. As a result of the experiment, the similar good result as in Example 1 was obtained.

EXAMPLE 5

The process of Example 1 was repeated except for using the following resin:

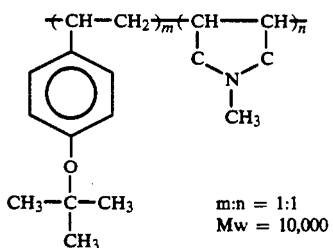

In this resin, an imido bonding is introduced to improve heat resistance. As a result of the experiment, a good result as in Example 1 was obtained.

EXAMPLE 6

The process of Example 1 was repeated except for using the following resin:

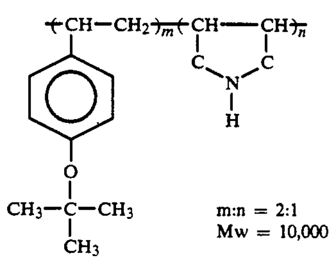

As a result, the similar good result as in Example 1 was obtained.

EXAMPLE 7

The process of Example 1 was repeated except for using the following resin:

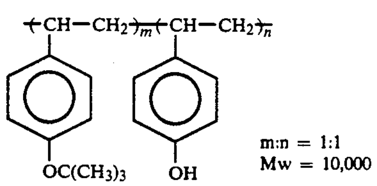

Poly(para-vinylstyrene) was introduced into the molecule of this resin to improve its heat resistance. Consequently, Tg of this resin became 160° C. At the same time, by introducing alkali-soluble group (—OH) into the molecule, improvement of adhesiveness to the hydrophobic substrate was aimed at. As a result, 0.3 μm L/S pattern in a good shape was formed.

EXAMPLE 8

The process of Example 1 was repeated except for using the following resin:

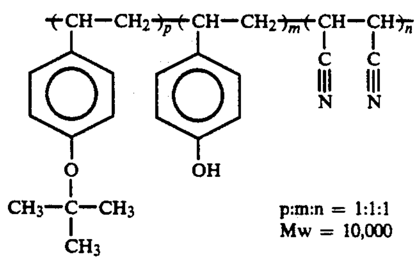

Poly(para-vinyl phenol) and C≡N were introduced into the molecule to improve the heat resistance, while a hydroxyl group was also introduced to improve adhesiveness at the same time. As a result, a good result was obtained.

EXAMPLE 9

The process of Example 1 was repeated except for using as the developer an aqueous solution of TMAH 2.38% and ethanol 5%. As a result, a good result as in Example 1 was obtained. Some examples of alcohol used as the developer in this Example are methanol, ethanol, isopropanol, n-propanol, n-butanol, isobutanol, etc. But any ones that add polarity to the developer can be used and not limited to the above alcohols. Although tert-butoxy group with high stability was used as an example of the group which shows alkali-soluble property in an acid atmosphere, there can be used other groups such as a tert-butoxycarbonate group, an isopropoxycarbonate group, a tetrahydropyranyl group, a tetrahydrofuranyl group, a trimethylsilyl group and so on but not limited thereto.

The same can be said with the photoacid generator. The compounds of the following formulae have good solution stability and acid generating efficiency and are expected to show good results when these are used in the pattern forming material. But those which can generate an acid by exposure to light can also be used and not limited thereto.

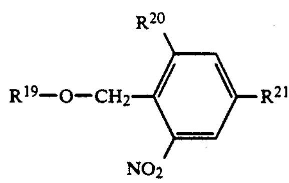

wherein $R^{19}$ is a trichloroacetyl group, a p-toluenesulfonyl group, a p-trifluoromethylbenzenesulfonyl group, a methanesulfonyl group or a trifluoromethanesulfonyl group; and $R^{20}$ and $R^{21}$ are independently a hydrogen atom, a halogen atom or a nitro group.

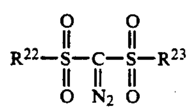

wherein $R^{22}$ and $R^{23}$ are independently a straight-chain, branched or cyclic alkyl group, a haloalkyl group, or a group of the formula:

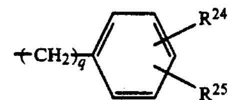

wherein $R^{24}$ and $R^{25}$ are independently a hydrogen atom, a halogen atom, a straight-chain, branched or cyclic alkyl group, a haloalkyl group, an alkoxy group, a nitro group or a cyano group.

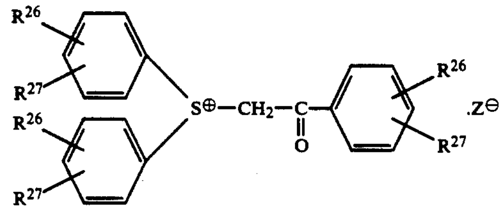

wherein $R^{26}$ and $R^{27}$ are independently a hydrogen atom, a halogen atom, a straight-chain, branched or cyclic alkyl group or an alkoxy group; and $Z^{\ominus}$ is a perchlorate ion, a toluenesulfonate ion or a trifluoromethanesulfonate ion.

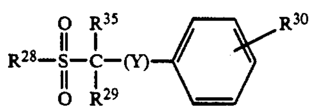

wherein Y is a carbonyl group, a sulfonyl group or a sulfinyl group; $R^{28}$ is a lower alkyl group, a trifluoromethyl group, a phenyl group or an alkyl-substituted phenyl group; $R^{29}$ and $R^{35}$ are independently a lower alkyl group, a halogen atom or a hydrogen atom; and $R^{38}$ is a hydrogen atom, a halogen atom, a lower alkyl group, an alkoxy group or an alkylthio group.

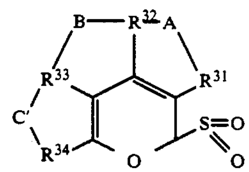

wherein $R^{31}$, $R^{32}$, $R^{33}$ and $R^{34}$ are independently a hydrogen atom, a halogen atom, a straight-chain, a branched or cyclic alkyl group, a haloalkyl group, an alkoxy group, an aralkyl group, a substituted phenyl group, a phenyl group, a nitro group or a cyano group; and $R^{31}$-$R^{32}$, $R^{32}$-$R^{33}$ and $R^{33}$-$R^{34}$ are independently an alicyclic ring, a hetero alicyclic ring, an aromatic ring or a hetero aromatic ring via A, B and C', respectively, each having 5 to 8 carbon atoms.

As the solvent, diethylene glycol dimethyl ether which shows a low absorption in the deep UV light region is used, in this invention. However those which can dissolve the resin and the photoacid generator can be used. Examples of such solvents are ethyl Cellosolve acetate, methyl Cellosolve acetate, ethyl lactate, methyl lactate, diethylene glycol monomethyl ether, diethylene glycol monobutyl ether, etc., but not limited thereto.

As to the exposure light source, there can be used anything that can generate an acid by exposure to light such as g-line (436 nm), i-line (365 nm), electron beams, X-rays, etc., but not limited thereto.

As mentioned above, this invention enables pattern formation with good adhesiveness by using the pattern forming material which has high sensitivity to deep UV lights, especially KrF excimer laser, high contrast and stability in the lithographyical method, and by the development using a developer mixed with an alcohol. Thus, this invention is applicable to super fine device of 0.3 μm rule and so on. As a result, this invention exhibits a great industrial value in the promotion of micronization of semiconductor elements and so on, with higher productivity.

What is claimed is:

1. A process for forming a positive pattern which comprises forming on a substrate a film of pattern forming material comprising (a) a resin having functional groups capable of becoming alkali-soluble under an acid atmosphere, (b) a photosensitive compound being able to generate an acid by exposure to light, and (c) a solvent for dissolving both the components (a) and (b), exposing the film selectively to deep ultraviolet light, subjecting the resulting film to heat treatment, and developing the resulting film with a mixed solvent comprising tetramethylammonium hydroxide and an amount, sufficient to improve the adhesion of said positive pattern to said substrate of an alcohol to form the desired positive pattern.

2. A process according to claim 1, wherein the alcohol is methanol, ethanol, isopropanol or a mixture thereof.

3. A process according to claim 1, wherein the substrate has an insulating film, an electroconductive film or a semiconductor film on the surface thereof.

* * * * *